Jan. 26, 1960 M. G. FAKIRIS 2,922,878

EQUIPMENT FOR THE REMOVAL OF PHASE AND/OR FREQUENCY MODULATION OF A MODULATED OSCILLATION

Filed April 9, 1956 2 Sheets-Sheet 1

INVENTOR

Michael G. Fakiris

BY [signature]

ATTORNEY

FIG. 5
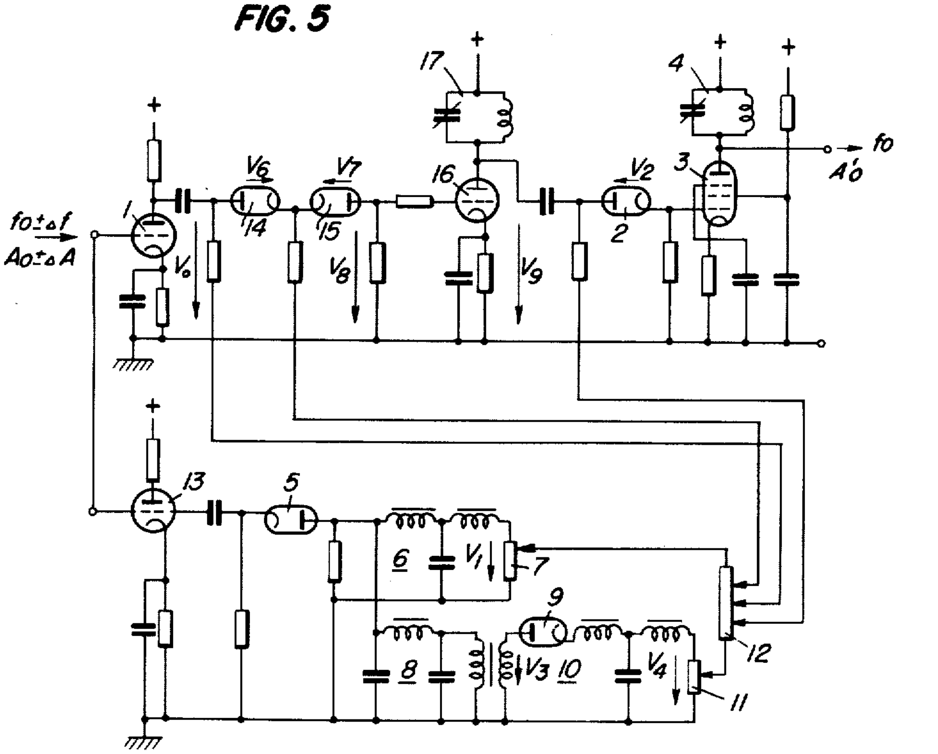
FIG. 6a FIG. 6b
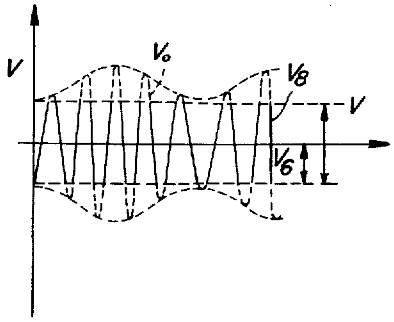
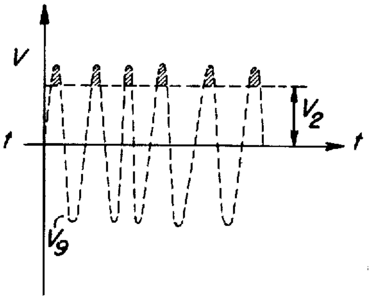
INVENTOR
Michael G. Fakiris
BY [signature]
ATTORNEY United States Patent Office
2,922,878
Patented Jan. 26, 1960

2,922,878

EQUIPMENT FOR THE REMOVAL OF PHASE AND/OR FREQUENCY MODULATION OF A MODULATED OSCILLATION

Michael G. Fakiris, Athens, Greece

Application April 9, 1956, Serial No. 577,092
6 Claims. (Cl. 250—27)

Figure 1:
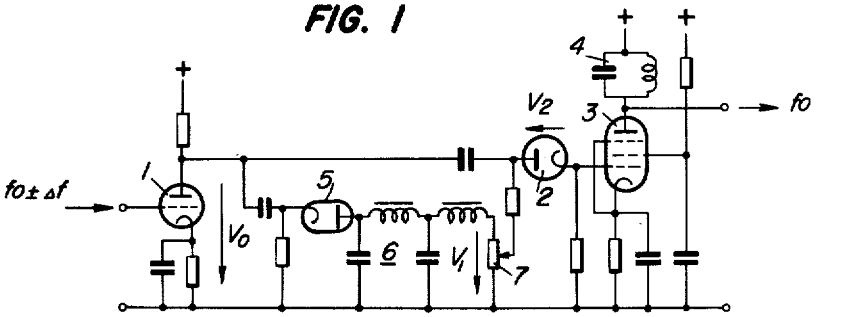

The present invention relates to an equipment for the removal of the phase and/or frequency modulation of a modulated oscillation. Such equipment may be used wherever it is desired to draw off the carrier frequency from a phase and/or frequency modulated oscillation, e.g. for producing an unmodulated or in any case an only amplitude modulated reference oscillation for transmission, receiving, measurement or regulating purposes.

The equipment covered by this invention is distinguished through the fact that an oscillating circuit tuned on the carrier frequency is excited from the selected oscillation peaks. It can be shown that the ratio of the modulation energy at the oscillation peaks, which affects equally in time the oscillation arising at the oscillation circuit on account of its inertia, to the carrier energy of the arising oscillation, may be substantially smaller than the corresponding energy ratio at the original oscillation although the oscillation peaks show the same phase and/or frequency deviation with the original oscillation. For this reason an oscillation may be created through the equipment invented, which shows practically no phase and/or frequency modulation. This effect is further increased through the frequency dependence of the oscillation circuit impedance to a degree depending on the quality of the circuit (Q).

The said frequency dependence on the oscillation circuit impedance would possibly itself offer the possibility of removal of the phase and/or frequency modulation in so far as the modulated oscillation contrary to the invention could be conducted through several oscillating circuits connected in series. It must however be observed that the cost of such an arrangement would be much higher than that of the equipment according to this invention.

Still more appropriately the modulated oscillation should be led to a rectifier with a preset voltage level and after amplification into the tuned circuit at which the oscillation now practically free from the phase and/or frequency modulation can be taken up. The harmonics resulting from the rectifying will be further substantially removed by the tuned circuit. The ratio between the in-coming and out-going voltage at the equipment is given by the circuit constants and the linear amplification constants.

On the basis of the attached drawing, three methods of application of the invention are given in full detail. In these explanations only the frequency modulation is mentioned because of the similarity existing with the phase modulation.

In the drawing the following stand for:

Fig. 1 is a circuit diagram of an apparatus for obtaining the carrier frequency from a frequency modulated wave.

Figures 2A, 2B, 3, 4A, 4B, 4C:
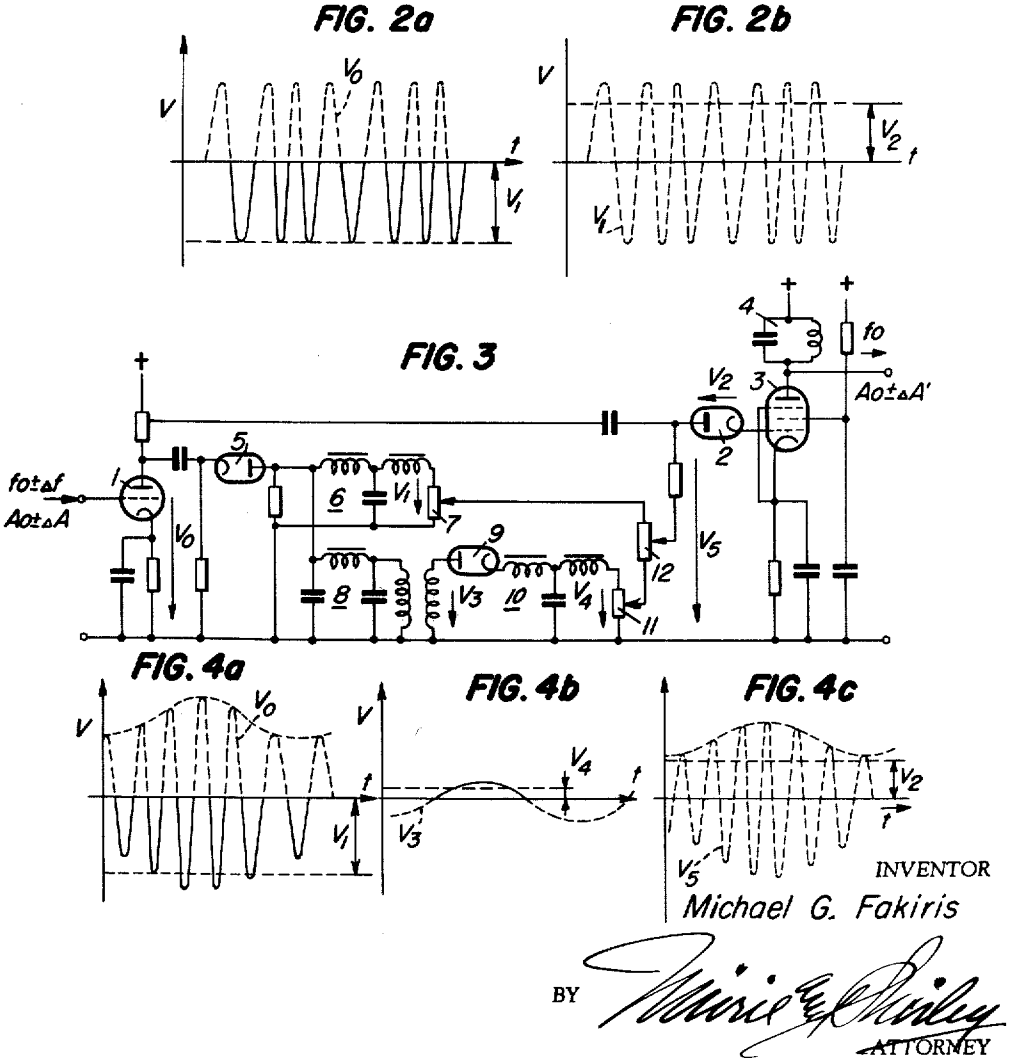

Figs. 2*a*, 2*b* are wave diagrams showing the fluctuations of the voltage with time.

Fig. 3 is a circuit diagram of an apparatus for obtaining the amplitude modulated carrier oscillation from a simultaneous frequency and amplitude modulated wave.

Figs. 4*a*, 4*b* and 4*c* are wave diagrams showing the fluctuations of the voltage with time.

Fig. 5 is a circuit diagram of an apparatus for obtaining the unmodulated carrier frequency from a simultaneously frequency and amplitude modulated wave.

Figs. 6*a*, 6*b* are wave diagram showing the fluctuation of the voltage with time.

According to Fig. 1 the frequency modulated oscillation with a carrier frequency $f_0$ and the modulation of $\pm\Delta f$ in tube 1, is first amplified and then rectified with the help of the connected diode 2 with a preset voltage level. The remaining oscillation peaks reach the grid of a further amplification tube 3 in the anode circuit of which is connected oscillation circuit 4 and tuned to the carrier frequency $f_0$. The oscillation generated in it through the amplified oscillation peaks with carrier frequency $f_0$ is practically free of modulation. In order to ensure the right proportion between the in-coming and out-going voltage, it is of advantage to employ no fixed preset connection for diode 2 but one dependent on the amplitude of the modulated oscillation. For this purpose, in the example given, this preset voltage level is generated through rectification of the amplified modulated oscillations with the assistance of diode 5 and thereafter filtered through the corresponding circuit. The most advantageous value of the preset voltage level may be set at the potentiometer 7 which must be a little smaller than the amplitude of the modulated oscillation. Otherwise the wiring consists of the usual elements for coupling and uncoupling and the generation of the operating voltage for the tubes.

Figs. 2*a* and 2*b* show the amplified voltage $V_0$ of the modulated oscillation in function of time. In particular, Fig. 2*a* shows the voltage $V_1$ obtained at diode 5 through the peak rectification and Fig. 2*b* the selected peak through diode 2 after level setting by voltage $V_2$.

The equipment as per wiring diagram shown in Fig. 3 differs from the one already described in that it provides for an additional preset voltage level. In accordance with this preliminary condition the oscillation led into the equipment consists of a carrier frequency $f_0$ of an amplitude $A_0$ a frequency modulation $\pm\Delta f$ and an amplitude modulation $\pm\Delta A$. In order to obtain that the amplitude modulation of the modulated oscillation will be drawn off without distortion the voltage level at the diode 2 should always be smaller than the smallest amplitude of the oscillation to be rectified. For this purpose the preset voltage built up through the difference of two partial voltages one of which corresponds to the medium amplitude of the modulated oscillation and the other to the medium modulation amplitude so that when the oscillation amplitude is increased or decreased and/or the modulation amplitude is decreased the preset level may be raised up or reduced. The voltage $V_1$ corresponding to the medium oscillation amplitude is in its turn generated through rectification of the modulated oscillation by the assistance of diode 5 and a later filtering through filter 6 and appears at potentiometer 7. From the rectified oscillation the modulating oscillation is filtered out through diode 9 and filtered through filter 10 so that at potentiometer 11 a voltage corresponding to the modulating voltage $V_4$ appears. The difference between the voltage of potentiometer 7 and 11 will arise at potentiometer 12 and in this manner a voltage proportional to the voltage difference $V_2$ will be created for diode 2.

Fig. 4 represents the voltage V of the amplified modulated oscillation and the part tension obtained through $V_1$ and Fig. 4*b* the modulation voltage $V_3$ arising from the demodulation of amplitude with the same voltage $V_4$ drawn off. Fig. 4*c* shows the voltage $V_6$ of the modulated oscillation led into diode 2 and the oscillation peaks selected on the basis of the voltage level $V_2$.

In the same manner as in case of Fig. 1 in the oscillation circuit 4 will be generated through the oscillation peaks amplified in tube 3 an oscillation of the carrier frequency $f_0$ and the carrier amplitude $A_0$ which has only an amplitude modulation $\pm\Delta A$ but practically no more frequency modulation.

In the equipment as per Fig. 5 the frequency and amplitude modulated oscillation is led into a rectifier with preset voltage level for the limitation of the amplitude variations. In order that the amplitude modulation may be fully drawn off irrespective of the height of the carrier amplitude and the modulation degree in this case also the preset voltage levels to the rectifier should be smaller than the smallest amplitude of the modulated oscillation. It is therefore necessary that this preset voltage level be created in the same manner as shown in Fig. 3. To mark the difference the modulated oscillation of the arrangement for the creation of the preset voltage level is in this example carried through a separate amplification tube 13.

The amplified modulated oscillation in tube 1 after limiting the amplitude modulation through the connected diodes 14 and 15 at the grid of an amplification tube 16 in the anode of which is connected an oscillation circuit 17 tuned to the carrier frequency $f_0$ for the purpose of drawing off the harmonics created through the limitation of the amplitude modulation. At last from the remaining frequency modulated oscillation as above the oscillation peaks are selected for the excitation of oscillation circuit 4 in order that at the output a carrier frequency $f_0$ practically free of amplitude and frequency modulation can be obtained.

Fig. 6*a* shows the operation of the amplitude modulation limiter. The resulting oscillation peaks are shown in Fig. 6*b*.

What I claim is:

1. A circuit to obtain the carrier frequency by removal of modulation intelligence from a signal wave, comprising a signal input, an amplifier having a tank circuit tuned to oscillate on the carrier frequency of said signal wave, a first rectifier connected between said signal input and an input grid of said amplifier, and additional signal rectifier means connected between said signal input and the input of said first rectifier to provide a preset input voltage to said first rectifier and limit the output thereof to selected peaks of said modulated signal wave for providing said oscillating tank circuit with continuously interrupted excitation.

2. A circuit as described in claim 1 wherein is provided means for varying the output voltage of said additional rectifier means to permit the preselection of the voltage of said first rectifier exciting the said amplifier and oscillating tank circuit.

3. A circuit as described in claim 1 wherein is provided a filter and means for varying the voltage in the output of said additional rectifier means to permit preselection of the voltage of said first rectifier exciting the said amplifier and oscillating tank circuit.

4. A system to obtain the carrier frequency by removal of intelligence modulation other than amplitude modulation from a signal wave having frequency phase and amplitude modulation, comprising a signal input, an amplifier having an anode connected tank circuit tuned to oscillate on the carrier frequency of said signal wave, a diode connected between said signal input and an input grid of said amplifier, and means connected to said signal input and the input of said diode to apply a variable preselected voltage slightly smaller than the amplitude of the modulated signal to the input of said diode for limiting the output thereof.

5. A system as described in claim 4 wherein said means to apply a preselected voltage to the input of the diode comprises rectifier circuits arranged in parallel to provide said preselected voltage as the difference between the rectified voltage of the modulated signal and the rectified voltage of the amplitude modulations thereof.

6. A system to obtain the carrier frequency by removal of intelligence modulations from a signal wave having frequency, phase and amplitude modulation comprising an oscillator tuned to the carrier frequency connected to a signal input through a rectifier for exciting said oscillator, a limiter circuit for removal of amplitude modulations of said signal connected in series between the signal input and rectifier, and a pair of rectifier circuits in parallel to provide a preselected voltage to the input side of said rectifier as the difference between the rectified voltage of the modulated signal and the rectified voltage of the amplitude modulations also arranged in parallel with said limiter circuit, whereby said preselected voltage applied to said rectifier is free of amplitude variation and the output of the oscillator is free of frequency, phase and amplitude modulation.

References Cited in the file of this patent

UNITED STATES PATENTS

| | | |
|---|---|---|
| 2,108,117 | Gardere et al. | Feb. 15, 1938 |
| 2,227,197 | Percival | Dec. 31, 1940 |
| 2,403,557 | Sanders | July 9, 1946 |
| 2,529,547 | Fisher | Nov. 14, 1950 |
| 2,595,124 | Campbell | Apr. 29, 1952 |
| 2,681,988 | Oliver | June 22, 1954 |
| 2,722,607 | Rubin | Nov. 1, 1955 |

FOREIGN PATENTS

| | | |
|---|---|---|
| 713,168 | Great Britain | Aug. 4, 1954 |